US012755945B2

(12) United States Patent
Tseng et al.

(10) Patent No.: US 12,755,945 B2
(45) Date of Patent: Oct. 6, 2026

(54) PLASMA PROCESSING APPARATUS AND GAS EXHAUST METHOD

(71) Applicant: Hitachi High-Tech Corporation, Tokyo (JP)

(72) Inventors: Tzu Wei Tseng, Tokyo (JP); Akito Kochi, Tokyo (JP); Kenji Imamoto, Tokyo (JP); Yuzuru Yamamoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 16 days.

(21) Appl. No.: 18/279,460

(22) PCT Filed: May 18, 2022

(86) PCT No.: PCT/JP2022/020737
§ 371 (c)(1),
(2) Date: Aug. 30, 2023

(87) PCT Pub. No.: WO2023/223481
PCT Pub. Date: Nov. 23, 2023

(65) Prior Publication Data

US 2025/0069867 A1 Feb. 27, 2025

(51) Int. Cl.
*H01J 37/32* (2006.01)
*H10P 72/00* (2026.01)

(52) U.S. Cl.
CPC .... *H01J 37/32834* (2013.01); *H01J 37/3244* (2013.01); *H01J 37/32926* (2013.01);
(Continued)

(58) Field of Classification Search
CPC .. H01J 37/32; H01J 37/32192; H01J 37/3244; H01J 37/32449; H01J 37/32834;
(Continued)

(56) References Cited

U.S. PATENT DOCUMENTS 12,098,460 B2 * 9/2024 Shiba .................. C23C 16/4412
2002/0192369 A1 * 12/2002 Morimoto ......... C23C 16/45561 118/712

(Continued)

FOREIGN PATENT DOCUMENTS

CN 114256086 A 3/2022
JP H04-180567 A 6/1992

(Continued)

OTHER PUBLICATIONS

Office Action mailed Mar. 28, 2024 in Taiwanese Application No. 112106937.

(Continued)

*Primary Examiner* — Benjamin Kendall
(74) *Attorney, Agent, or Firm* — Miles & Stockbridge, P.C.

(57) ABSTRACT

A plasma processing apparatus capable of reducing an error in operation by automating exhaust via a gas pipe, including a first valve disposed between a gas cylinder and a mass flow controller; a second valve configured to exhaust a gas filled from a dry pump side; a third valve disposed downstream of the mass flow controller; a fourth valve configured to exhaust a gas filled in a third valve side; a first pressure gauge provided between the first valve and the mass flow controller; a second pressure gauge disposed between a dry pump and a turbo molecular pump; and a control device configured to open the second valve and the fourth valve to exhaust the filled gas and monitor until a pressure difference between the first pressure gauge and the second pressure gauge becomes equal, and then closing the second valve and the fourth valve; and a repeating.

5 Claims, 4 Drawing Sheets

(52) U.S. Cl.
CPC .... *H10P 72/0402* (2026.01); *H01J 37/32192* (2013.01); *H01J 2237/334* (2013.01)

(58) Field of Classification Search
CPC .......... H01J 37/32926; H01J 2237/334; H10P 50/242; H10P 72/0402; H01L 21/3065; H01L 21/67017
See application file for complete search history.

(56) References Cited

U.S. PATENT DOCUMENTS

| | | | | |
|---|---|---|---|---|
| 2004/0118342 | A1* | 6/2004 | Cheng | C23C 16/455 118/715 |
| 2008/0078505 | A1* | 4/2008 | Kofuji | H10P 50/267 257/E21.252 |
| 2019/0164725 | A1* | 5/2019 | Kawakami | H01J 37/32449 |

FOREIGN PATENT DOCUMENTS

| | | | | |
|---|---|---|---|---|
| JP | 2003197543 | A | * | 7/2003 |
| JP | 2012-238772 | A | | 12/2012 |
| JP | 2017-084882 | A | | 5/2017 |

OTHER PUBLICATIONS

Search Report dated Aug. 2, 2022 in International Application No. PCT/JP2022/020737.

* cited by examiner

[FIG. 1]
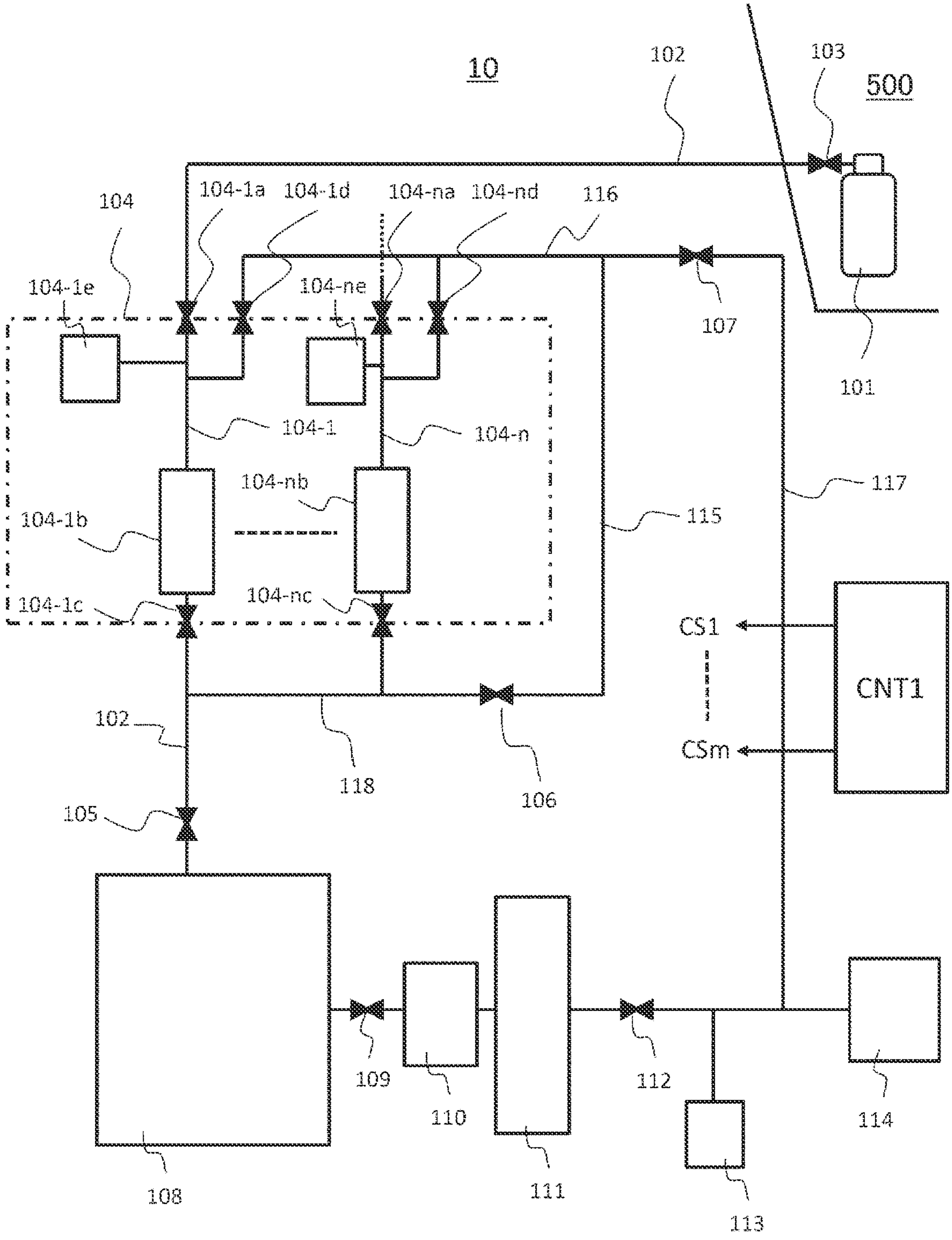

[FIG. 2]
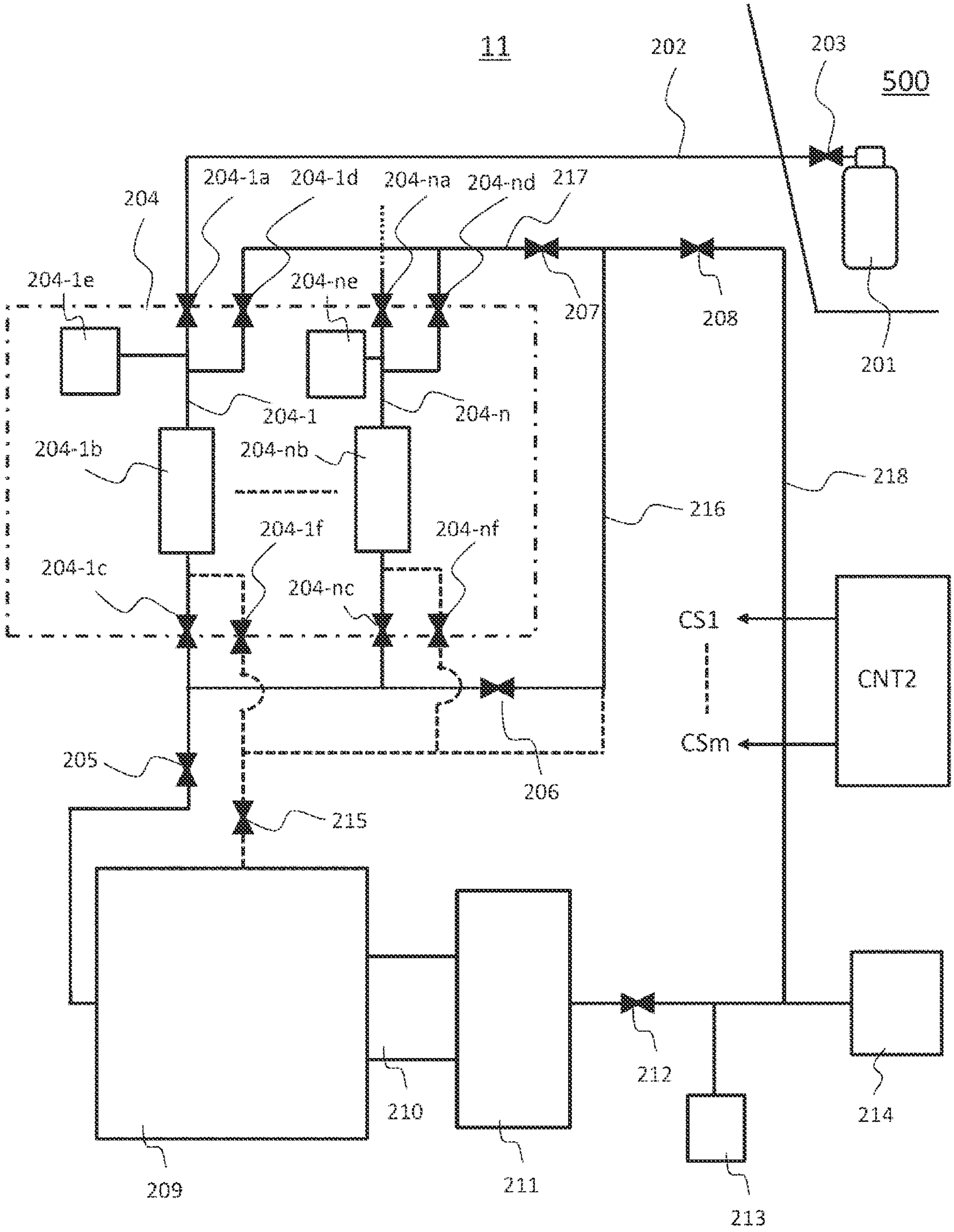

[FIG. 3]
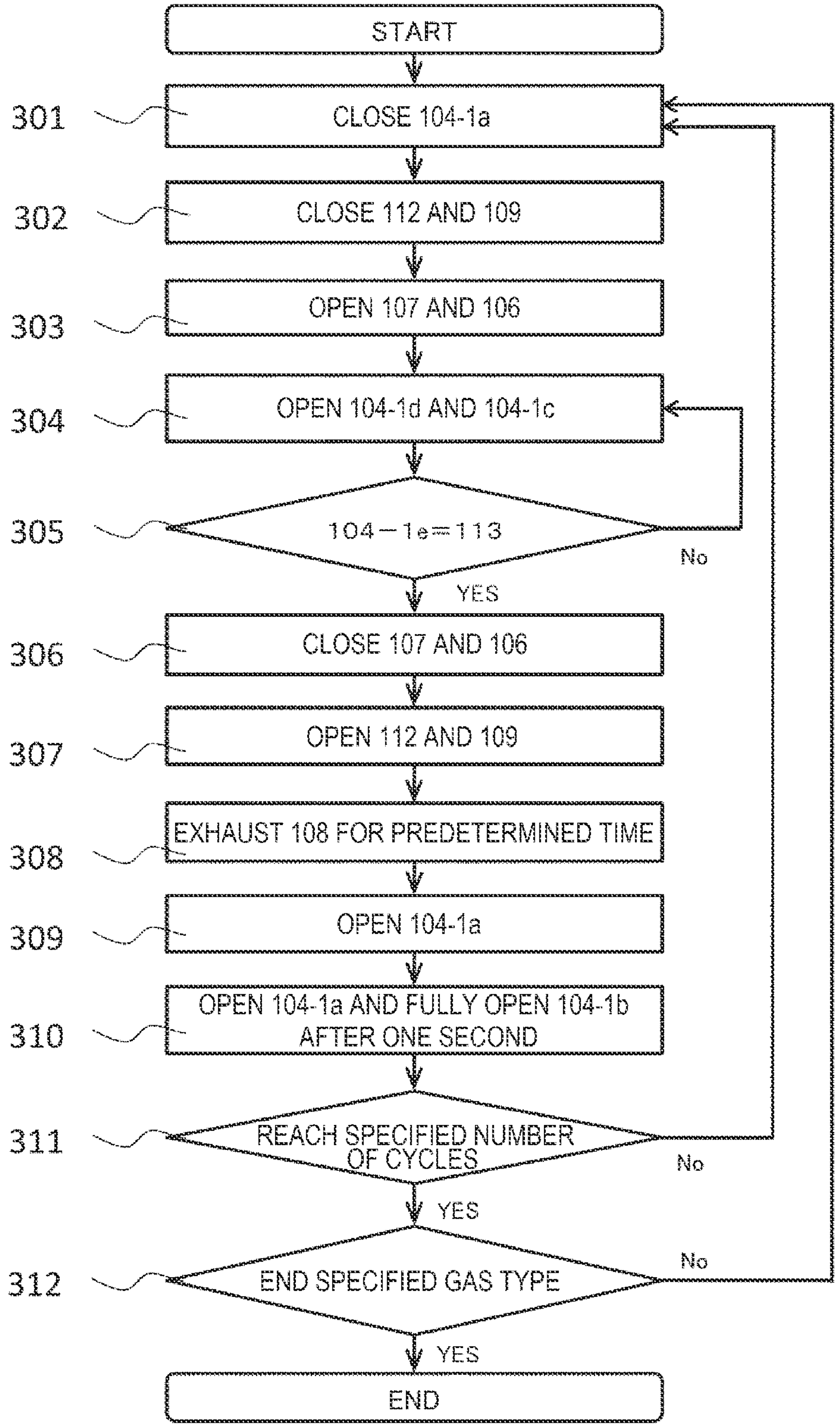

[FIG. 4]
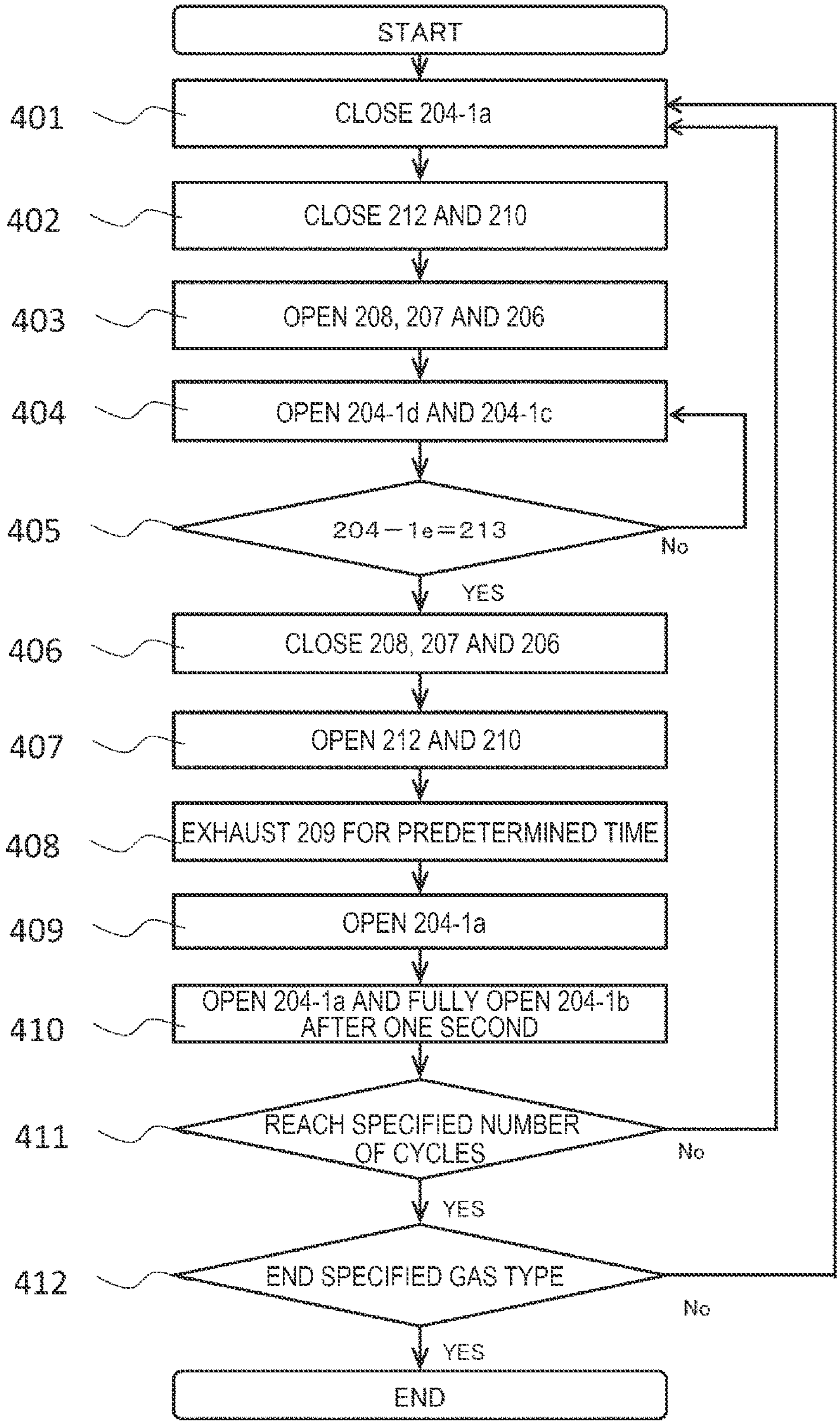

PLASMA PROCESSING APPARATUS AND GAS EXHAUST METHOD

TECHNICAL FIELD

The present disclosure relates to a plasma processing apparatus and a gas exhaust method, and more particularly, to a plasma processing apparatus and a gas exhaust method capable of reducing metal contamination caused by a gas pipe.

BACKGROUND ART

For a gas pipe on a primary side of a semiconductor manufacturing device such as a plasma processing apparatus, it is necessary to branch and add a gas pipe every time a semiconductor manufacturing device or a processing chamber (chamber) is additionally provided. In addition, foreign matter and a metal contamination source of metal contamination (Cr, Fe) are likely to remain in the gas pipes after construction.

For a purpose of reducing the above metal contamination source, PTL 1 proposes work of closing a supply valve on a primary side and exhausting a filled gas in a semiconductor manufacturing device. At this time, it is conceivable that each gas line is manually exhausted, such as by manual operation. By the work, a state of a chromium passivation film in a gas pipe can be stabilized, and the metal contamination source caused by the gas pipe can be reduced.

CITATION LIST

Patent Literature

PTL 1: JP2017-84882A

SUMMARY OF INVENTION

Technical Problem

It is conceivable that although the contamination source caused by the gas pipe can be reduced by a technique described in PTL 1, when an operator manually opens and closes all valves on the primary side of the gas line in a semiconductor manufacturing factory, which is a customer house, an event of a gas mixing may occur due to an error in operation. In addition, in this case, it is conceivable that since exhaust work is a manual operation, the operator cannot get away from the place, and work efficiency is deteriorated.

An object of the disclosure is to provide a technique for a plasma processing apparatus capable of reducing an error in operation by automating exhaust work of a gas pipe.

Other problems and novel features will be apparent from description of the present specification and accompanying drawings.

Solution to Problem

Outlines of a representative one of the disclosure will be briefly described as follows.

A plasma processing apparatus according to an embodiment includes: a processing chamber in which a sample is to be plasma-processed; a radio frequency power supply configured to supply radio frequency power for generating plasma; a sample stage on which the sample is to be placed; a gas supply mechanism configured to supply a gas to the processing chamber; an exhaust device configured to exhaust the gas; and a control device configured to execute a sequence of exhausting a gas filled from a gas cylinder in stages and ending gas exhaustion based on a pressure on an exhaust side of the exhaust device and a gas pressure of the gas cylinder.

In addition, a plasma processing apparatus according to an embodiment includes: a first valve disposed between a gas cylinder and a mass flow controller; a second valve configured to exhaust a gas filled from a dry pump side; a third valve disposed downstream of the mass flow controller; a fourth valve configured to exhaust a gas filled in a third valve side; a first pressure gauge provided between the first valve and the mass flow controller and configured to monitor a pressure of the gas cylinder; a second pressure gauge disposed between a dry pump and a turbo molecular pump; and a control device.

The control device is configured to execute: a filling step of filling the gas cylinder to the third valve with a gas and closing the first valve; an exhaust step of opening the second valve and the fourth valve and exhausting the filled gas, after the filling step; a monitoring step of monitoring until a pressure difference between the first pressure gauge and the second pressure gauge becomes equal, and then closing the second valve and the fourth valve; and a repeating step of repeating the filling step, the exhaust step, and the monitoring step a predetermined number of times.

That is, the first valve disposed in the plasma processing apparatus is closed to exhaust a gas pipe in an automatic sequence without manually opening and closing a primary side valve in a gas line of a semiconductor manufacturing factory, which is a customer house. After the above is ended, in the automatic sequence, the first valve in the plasma processing apparatus is opened, and the gas pipe is filled with the gas. After the gas pipe is filled with the gas, the first valve is closed again, and the gas pipe is exhausted. By repeating the above, a metal contamination source remaining in the gas pipe is exhausted together with the filled gas by the dry pump through an exhaust pipe of the plasma processing apparatus.

Advantageous Effects of Invention

A plasma processing apparatus according to an embodiment can reduce a metal contamination source existing in a gas pipe. In addition, an error in operation can be reduced by automating exhaust work of the gas pipe. Further, the exhaust work of the gas pipe can be performed for 24 hours even when an operator is absent.

Although it is also possible to select a plurality of pipes at the same time in order to shorten an exhaust time, there is a risk of explosion when a combustible gas and a combustion-supporting gas are mixed. However, in the invention, by dividing into a combustible category and a combustion-supporting category, gases in the same category can be exhausted from a plurality of pipes, so that it is possible to shorten the exhaust time. Therefore, the metal contamination source caused by the gas pipe can be reduced in a short time.

BRIEF DESCRIPTION OF DRAWINGS

FIG. 1 is a schematic view illustrating an introduction mechanism and an exhaust mechanism for a processing gas of a microwave plasma etching device including a single-gas injection mechanism according to a first embodiment.

FIG. 2 is a schematic view illustrating an introduction mechanism and an exhaust mechanism for a processing gas of a microwave plasma etching device including a multi-gas injection mechanism according to a second embodiment.

FIG. 3 is a flow chart illustrating an operation flow of each valve in cycle purge work and is used to describe a gas exhaust method of the microwave plasma etching device including the single-gas injection mechanism according to the first embodiment.

FIG. 4 is a flow chart illustrating an operation flow of each valve in cycle purge work and is used to describe a gas exhaust method of the microwave plasma etching device including the multi-gas injection mechanism according to the second embodiment.

DESCRIPTION OF EMBODIMENTS

Embodiments related to the invention will be described below with reference to the drawings.

First Embodiment

FIG. 1 is a schematic view illustrating an introduction mechanism and an exhaust mechanism for a processing gas of a microwave plasma etching device including a single-gas injection mechanism according to a first embodiment. FIG. 3 is a flow chart illustrating an operation flow of each valve in cycle purge work and is used to describe a gas exhaust method of the microwave plasma etching device including the single-gas injection mechanism according to the first embodiment.

In the first embodiment, as an example of a semiconductor manufacturing device, a microwave plasma etching device (hereinafter, also referred to as an etching device) 10, which is a plasma processing apparatus, will be described as an example. Here, the microwave plasma etching device 10 including the single-gas injection mechanism will be described with reference to FIGS. 1 and 3. The single-gas injection mechanism means a configuration in which there is only one gas supply portion to a processing chamber 108 of the etching processing device 10. The etching processing device 10 includes the processing chamber 108 in which a sample such as a semiconductor wafer is plasma-processed, a radio frequency power supply (RF bias power supply) for supplying radio frequency power for generating plasma, a sample stage on which the sample is to be placed, a gas supply mechanism that supplies a gas to the processing chamber 108, and an exhaust device that exhausts the gas.

(Configuration Example of Introduction Mechanism and Exhaust Mechanism for Processing Gas of Etching Device 10)

As illustrated in FIG. 1, in the etching device 10, a gas cylinder 101, which is a gas supply source, is coupled to a gas pipe 102, which is a gas supply pipe, and a path for supplying a gas into the processing chamber 108 is provided as a gas supply mechanism. Here, a gas pipe provided between the gas cylinder 101 and the processing chamber 108 serves as the gas pipe 102.

Valves 103 and 105 for opening or closing an internal flow path of the gas pipe 102 are disposed on a path of the gas pipe 102, and the valve 105 opens and closes the flow path of the gas pipe 102 according to intermittence of processing in the processing chamber 108. The gas cylinder 101 and the valve 103 can be referred to as facilities on a semiconductor manufacturing factory 500 side. In FIG. 1, configurations other than the gas cylinder 101 and the valve 103 are provided in the etching device 10.

On the path of the gas pipe 102, a mass flow controller box 104, which is an introduction path of a plurality of gases is provided upstream of the valve 105. The mass flow controller box 104 can be referred to as a gas flow rate control device. The mass flow controller box 104 includes n gas paths of gas lines 104-1 to **104-*n*, and gases of substances with elements different or compositions (different types) flow through the gas lines 104-1 to 104-*n* respectively. Different types of gases flowing through the gas lines 104-1 to 104-*n* serve as processing gases to be mixed in a merging portion, and flow through an inside of the gas pipe 102 toward the processing chamber 108**.

The processing gas introduced into the processing chamber 108 is exhausted by operations of a turbo molecular pump 111 and a dry pump 114, which are vacuum pumps, which are exhaust devices. An amount and a speed of the exhausted gas vary depending on a rotation speed of the turbo molecular pump 111 and an area of an opening corresponding to an angle of a variable conductance valve 110. In addition, a pressure value and a vacuum degree in the processing chamber 108 are adjusted by a balance between an amount and a speed of supply of the processing gas and an amount and a speed of exhaustion from the variable conductance valve 110. A valve 109 is provided between the processing chamber 108 and the variable conductance valve 110, and a valve 112 is provided between the turbo molecular pump 111 and the dry pump 114.

On the paths of the gas lines 104-1 to **104-*n*, mass flow controllers 104-1*b* to 104-*nb*, which are controllers for variably increasing and decreasing a flow rate and a speed of a gas flowing inside each of the paths of the gas lines 104-1 to 104-*n* are respectively arranged, and valves 104-1*a* to 104-*na* and valves 104-1*c* to 104-*nc* for opening or closing the gas lines 104-1 to 104-*n* are respectively arranged before and after the mass flow controllers 104-1*b* to 104-*nb*. In addition, the gas lines 104-1 to 104-*n*, which are internal gas pipes, are coupled to the gas cylinder 101, which is a gas supply source on the upstream side. The gas lines 104-1 to 104-*n* are provided with first pressure gauges 104-1*e* to 104-*ne* for monitoring a pressure of the gas cylinder 101, respectively. The valve 105 is disposed between the valves 104-1*c* to 104-*nc* and the processing chamber 108**.

Bypass lines 118 and 115, which are exhaust pipes, are coupled between the valve 105 and a merging portion where the gas lines 104-1 to **104-*n* or the mass flow controller box 104 on the path of the gas pipe 102 merge. The bypass line 115 includes a coupling portion with a bypass line 117, which is an exhaust pipe in which one end portion is coupled to an inlet of the dry pump 114. In addition, a valve 106 for opening or closing an internal flow path is provided on paths of the bypass lines 118 and 115. Each of the gas lines 104-1 to 104-*n* includes a purge line 116, which is a gas purge path coupled to the bypass line 117, and includes valves 104-1*d* to 104-*nd* for opening or closing an internal flow path on each path of the purge line 116**.

The dry pump 114 is usually an exhaust pump coupled to an exhaust port of the turbo molecular pump 111. The turbo molecular pump 111 has low exhaust efficiency, and cannot perform the exhaustion in the gas pipe 102, the mass flow controller box 104, the gas lines 104-1 to **104-*n*, or the processing chamber 108 that are within a relatively high pressure range in which exhaustion cannot be performed. Therefore, on a path of a line coupling the turbo molecular pump 111 and the inlet of the dry pump 114, the valve 112 for opening or closing the internal flow path is disposed closer to a turbo molecular pump 111 side than the coupling portion to which the bypass line 117 is coupled. A second pressure gauge 113 is provided between the valve 112 and the dry pump 114. By closing the flow path by the valve 112, the gas pipe 102, the mass flow controller box 104, the gas lines 104-1 to 104-*n* or the processing chamber 108 can be efficiently exhausted via the bypass line 117 from an atmospheric pressure to a depressurized state of a high vacuum degree that can be used by the turbo molecular pump 111 (a roughing line of the processing chamber 108 is not illustrated). A valve 107 for opening or closing an internal flow path of the bypass line 117 is disposed on the paths of the purge line 116 and the bypass line 117**.

The etching device 10 includes a control device CNT1, and can control, based on control signals CS1 to CSm, valve opening and closing operations of the valve 103, the valves **104-1*a* to 104-*na*, the mass flow controllers 104-1*b* to 104-*nb*, the valves 104-1*c* to 104-*nc*, the valves 104-1*d* to 104-*nd*, the valves 105-107, 109, and 112, and the variable conductance valve 110, and operations of the turbo molecular pump 111 and the dry pump 114. In addition, the control device CNT1 can acquire measurement values of the mass flow controllers 104-1*b* to 104-*nb*, can be connected to pressure gauges 104-1*e* to 104-*ne* and 113, and can acquire pressure values measured by the pressure gauges 104-1*e* to 104-*ne* and 113**.

The control device CNT1 executes a sequence illustrated in FIG. 3 and automatically controls the opening and closing of each valve according to the sequence illustrated in FIG. 3. Although not illustrated, the control device CNT1 can perform, based on input setting (also referred to as a recipe) by an input unit, control of ON and OFF of a microwave power supply or control of frequency, control of ON and OFF of an RF bias power supply as a radio frequency power supply for supplying radio frequency power for generating plasma or control of frequency, and control of parameters of the microwave power supply and the RF bias power supply. In addition, a control unit 122 can control etching parameters such as a gas flow rate, a processing pressure, and a coil current for performing the etching, a temperature of the sample stage on which the sample is to be placed, and an etching time.

The control device CNT1 executes the sequence in FIG. 3 in which the gas from the gas cylinder 101 with which the gas pipe 104-1 is filled is divided and exhausted in stages, and the gas exhaustion is ended based on an exhaust pressure, which is a pressure on an exhaust side of the dry pump 114, and a gas pressure of the gas cylinder 101. When the valve 103, which is a stopcock of the gas cylinder 101, is open, the sequence illustrated in FIG. 3 is executed by the control device CNT1.

(Description of Flowchart)

In the first embodiment, first, the valve 103 disposed between the gas cylinder 101 and the gas connection valve **104-1*a* on an upper side of the mass flow controller box 104 maintains an open state (the valve 104-1*a* is in the open state, the mass flow controller 104-1*b* is in the open state, and the valve 105 between the valve 104-1*c* and the processing chamber 108 is in a closed state), and the valve 104-1*a* disposed between the gas cylinder 101 and the mass flow controller 104-1*b* is closed (301). Accordingly, the gas pipe 102 including the gas line 104-1 is filled with the gas from the gas cylinder 101. (301) can be referred to as a filling step. The filling step may include (301), and (309) and (310**) described later.

Next, in order to exhaust a metal contamination source remaining in the gas pipes 102 and 104-1 without passing through the processing chamber 108 of the etching processing device 10, the valve 112 disposed between the dry pump 114 and the processing chamber 108 is closed, and the valve 109 disposed between the processing chamber 108 and the variable conductance valve 110 for controlling the pressure in the processing chamber 108 is closed (302).

Next, the dry pump 114, the valve 107 disposed on a gas supply side (a valve **104-1*d* side, a gas pipe 104-1 side), and the valve 106 disposed on a valve 104-1*c* side are opened (303), and the valve 104-1*c* and the valve 104-1*d* are opened in order to exhaust the gas remaining in the valve 104-1*d* (in the gas pipe 104-1) and the valve 104-1*c* from the valve 104-1*a*. Then, the dry pump 114 exhausts the gas remaining in the valve 104-1*d* (in the gas pipe 104-1) and the valve 104-1*c* from the valve 104-1*a* via the gas pipes 115, 116, 117, and 118 (304). (304) can be referred to as an exhaust step. The exhaust step may include (304), (302), and (303**).

At the time of exhaustion using the dry pump 114 (at the time of the exhaust step), monitoring (305) is performed until a pressure difference between the pressure gauge **104-1*e* and the pressure gauge 113 becomes zero (pressure value measured by the pressure gauge 104-1*e*=pressure value measured by the pressure gauge 113). If the pressure values are not equal (No), 304 is continued. If the pressure values are equal (YES), the valve 107 and the valve 106 are closed, and the exhaustion using the dry pump 114 is ended (306). (305) and (306) can be referred to as monitoring steps. The control device CNT1 ends the exhaustion (exhaust step) based on a pressure measurement value obtained by the pressure gauge 113 that measures the exhaust pressure of the dry pump 114 and a pressure measurement value obtained by the pressure gauge 104-1*e* that measures the gas pressure of the gas cylinder 101**.

Next, in order to lower the pressure in the processing chamber 108 of the etching processing device 10 that is increased in the above exhaust sequence, the valve 112 and the valve 109 are opened (307), and the exhaustion of the processing chamber 108 of the etching processing device 10 is performed for a predetermined time (308). (307, 308) can be referred to as a processing chamber exhaust step. For the exhaustion in the processing chamber exhaust step (307, 308), for example, the turbo molecular pump 111 and the dry pump 114 may be used. Thereafter, the valve **104-1*a* is opened, and the gas pipe 104-1 between the mass flow controller 104-1*b* and the valve 104-1*a* to the valve 104-1*d* is filled with gas (309). At this time, in order to also fill the valve 104-1*c* with the gas, the valve 104-1*a* is opened, and the mass flow controller 104-1*b* is fully opened after one second (310**).

As described above, since the invention is a sequence of repeating the gas filling (filling step), the exhaustion (exhaust step), and the monitoring (monitoring step), it is determined in (311) whether the number of performed cycles n (n being a positive integer) reaches a specified number of cycles N (N being a positive integer). (311) can be referred to as a repeating step. When it is determined in (311) that the number of performed cycles n does not reach the specified number of cycles N (n<N, 311: No), the processing returns to (301), and the filling sequence (filling step), the exhaust sequence (exhaust step), and the monitoring (monitoring step) described in (301 to 311) are repeated the specified number of cycles (N times). When it is determined in (311) that the number of performed cycles n reaches the specified number of cycles N (n=N, 311: Yes), the processing proceeds to (312). By performing the repeating step, the metal contamination source such as metal (Cr, Fe) remaining in the gas pipe (102) can be exhausted to an outside of the plasma processing apparatus 10 together with the filled gas by the dry pump (114) via the exhaust pipes (115, 116, 117, and 118) of the plasma processing apparatus 10.

The specified number of cycles (predetermined number of times) N is the number of times obtained by calculating a ratio of a length of the gas pipe 104-1 from the valve 104-1*a* to the valve 104-1*c* to a length of the gas pipe 102 from the gas cylinder 101 to the valve 104-1*a*.

After the repeating step (311), a determination step (312) of determining whether a specified gas type is ended is executed. In (312), whether the specified gas type is ended is determined, and when the specified gas type is ended (312: YES), the present sequence is ended. On the other hand, when the specified gas type is not ended (312: No), the processing proceeds to (301). Then, another specified gas is switched, and (301 to 311) is repeated. That is, when the other gas type is also performed, the processing returns to (301) again after the gas filling sequence and the exhaust sequence are ended (301 to 311), and the same operation as (301 to 311) is repeated for the other gas type.

As described above, the control device CNT1 executes the sequence illustrated in FIG. 3 in which the gas from the gas cylinder 101 with which the gas pipes 102 and 104-1 are filled is divided into a gas pipe 116 side and a gas pipe 118 side and is exhausted in stages, and the gas exhaustion is ended based on the exhaust pressure of the dry pump 114 (measured by the pressure gauge 113) and the gas pressure of the gas cylinder 101 (measured by the pressure gauge 104-1*e*).

As a gas exhaust method for exhausting the gas used in the plasma processing, there is a gas exhaust method of exhausting the gas filled from the gas cylinder 101 in stages, and ending the gas exhaustion based on the pressure on the exhaust side of the exhaust device (114) and the gas pressure of the gas cylinder 101.

By applying the sequence according to the first embodiment, it is possible to reduce the metal contamination source existing in the gas pipe.

The valve opening and closing is performed automatically by the control device CNT1 that executes the sequence illustrated in FIG. 3. Therefore, the operation can be performed for 24 hours even if an operator is not present, and since no human error occurs, it is possible to reduce gas mixture.

Since the filling and exhaust work of the gas is automatically executed by the control device CNT1 that executes the sequence illustrated in FIG. 3, the operator can get away from the place and work efficiency can be improved.

If the gases are in the same category of a combustible gas and a combustion-supporting gas, it is possible to select a plurality of pipes at the same time, and thus it is possible to shorten an exhaust time. When the gas lines 104-1, 104-2, and 104-3 are filled with gases of the same category in the filling step, the gas filling the gas lines 104-1, 104-2, and 104-3 can be simultaneously exhausted by the dry pump 114 via the lines 116, 118, and 117 in the exhaust step. Therefore, a metal contamination source caused by the gas pipe can be reduced in a short time.

In the first embodiment, the configuration has been described in which the valve opening and closing is automatically performed by the control device CNT1 that executes the sequence illustrated in FIG. 3, but the sequence illustrated in FIG. 3 may also be executed by an operator.

Second Embodiment

FIG. 2 is a schematic view illustrating an introduction mechanism and an exhaust mechanism for a processing gas of a microwave plasma etching device including a multi-gas injection mechanism according to a second embodiment. FIG. 4 is a flow chart illustrating an operation flow of each valve in cycle purge work and is used to describe a gas exhaust method of the microwave plasma etching device including the multi-gas injection mechanism according to the second embodiment.

In the second embodiment, a microwave plasma etching device (hereinafter referred to as an etching processing device) 11 including a multi-gas injection mechanism will be described with reference to FIGS. 2 and 4. The multi-gas injection mechanism means a configuration in which there are a plurality of gas supply portions (two gas supply portions in FIG. 2) to a processing chamber 209 of the etching processing device 11.

(Configuration Example of Introduction Mechanism and Exhaust Mechanism for Processing Gas of Etching Device 11)

As illustrated in FIG. 2, in the etching device 11, a gas cylinder 201, which is a gas supply source, is coupled to a gas pipe 202, and a path for supplying a gas into the processing chamber 209 is provided. Here, a gas pipe provided between the gas cylinder 201 and the processing chamber 209 serves as the gas pipe 202.

Valves 203, 205, and 215 for opening or closing an internal flow path of the gas pipe 202 are disposed on a path of the gas pipe 202, and the valves 205 and 215 open and close the flow path of the gas pipe 202 according to intermittence of processing in the processing chamber 209. The gas cylinder 201 and the valve 203 can be referred to as facilities on a semiconductor manufacturing factory 500 side. In FIG. 2, configurations other than the gas cylinder 201 and the valve 203 are provided in the etching device 11.

On the path of the gas pipe 202, a mass flow controller box 204, which is an introduction path of a plurality of gases is provided upstream of the valve 205. The mass flow controller box 204 includes n gas paths of gas lines 204-1 to 204-*n*, and gases of substances with different elements or compositions (different types) flow through the gas lines 204-1 to 204-*n* respectively. Different types of gases flowing through the gas lines 204-1 to 204-*n* serve a processing gases to be mixed in a merging portion, and flow through an inside of the gas pipe 202 toward the processing chamber 209.

The processing gas introduced into the processing chamber 209 is exhausted by operations of a turbo molecular pump 211 and a dry pump 214, which are vacuum pumps. An amount and a speed of the exhausted gas vary depending on a rotation speed of the turbo molecular pump 211 and an area of an opening corresponding to an angle of a variable conductance valve 210. In addition, a pressure value and a vacuum degree in the processing chamber 209 are adjusted by a balance between an amount and a speed of supply of the processing gas and an amount and a speed of exhaustion from the variable conductance valve 210. A valve 212 is provided between the turbo molecular pump 211 and the dry pump 214.

On the paths of the gas lines 204-1 to 204-*n*, mass flow controllers 204-1*b* to 204-*nb*, which are controllers for variably increasing and decreasing a flow rate and a speed of a gas flowing inside each of the paths of the gas lines 204-1 to 204-*n* are arranged respectively, and valves 204-1*a* to 204-*na*, valves 204-1*c* to 204-*nc*, and valves 204-1*f* to 204-*nf* for opening or closing the gas lines 204-1 to 204-*n* are respectively arranged before and after the mass flow controllers 204-1*b* to 204-*nb*. In addition, the gas lines 204-1 to 204-*n* are coupled to the gas cylinder 201, which is a gas supply source on the upstream side. The gas lines 204-1 to 204-*n* are provided with first pressure gauges 204-1*e* to 204-*ne* for monitoring a pressure of the gas cylinder 201, respectively. The valve 205 is disposed between the valves 204-1*c* to 204-*nc* and the processing chamber 209, and the valve 215 is disposed between the valves 204-1*f* to 204-*nf* and the processing chamber 209.

Bypass lines 218 and 216 are coupled between the valves 205 and 215 and a merging portion where the gas lines 204-1 to 204-*n* or the mass flow controller box 204 on the path of the gas pipe 202 merge. The bypass line 216 includes a coupling portion with the bypass line 218 in which one end portion is coupled to an inlet of the dry pump 214. In addition, a valve 206 for opening or closing an internal flow path is provided on a path of the bypass line 216. Each of the gas lines 204-1 to 204-*n* includes a purge line 217, which is a gas purge path coupled to the bypass line 218, and includes valves 204-1*d* to 204-*nd* for opening or closing an internal flow path on each path of the purge line 217.

The dry pump 214 is usually an exhaust pump coupled to an exhaust port of the turbo molecular pump 211. The turbo molecular pump 211 has low exhaust efficiency, and cannot perform the exhaustion in the gas pipe 202, the mass flow controller box 204, the gas lines 204-1 to 204-*n*, or the processing chamber 209 that are within a relatively high pressure range in which exhaustion cannot be performed. Therefore, on a path of a line coupling the turbo molecular pump 211 and the inlet of the dry pump 214, the valve 212 for opening or closing the internal flow path is disposed closer to a turbo molecular pump 211 side than the coupling portion to which the bypass line 218 is coupled. A second pressure gauge 213 is provided between the valve 212 and the dry pump 214. By closing the flow path by the valve 212, the gas pipe 202, the mass flow controller box 204, the gas lines 204-1 to 204-*n* or the processing chamber 209 can be efficiently exhausted via the bypass line 218 from an atmospheric pressure to a depressurized state of a high vacuum degree that can be used by the turbo molecular pump 214 (a roughing line of the processing chamber 209 is not illustrated). Valves 207 and 208 for opening or closing an internal flow path of the bypass line 218 is disposed on the paths of the purge line 217 and the bypass line 218.

The etching device 11 includes a control device CNT2, and can control, based on the control signals CS1 to CSm, operations of the valve 203, the valves 204-1 to 204-*na*, the mass flow controllers 204-1*b* to 204-*nb*, the valves 204-1*c* to 204-*nc*, the valves 204-1*d* to 204-*nd*, the valves 204-1*f* to 204-*nf*, the valves 205-208 and 212, the variable conductance valve 210, the turbo molecular pump 211, and the dry pump 214. In addition, the control device CNT2 is connected to the pressure gauges 204-1*e* to 204-*ne* and 213, and can acquire a measured pressure value.

The control device CNT1 executes a sequence illustrated in FIG. 4 and automatically controls the opening and closing of each valve according to the sequence illustrated in FIG. 4. Although not illustrated, the control device CNT2 can perform, based on input setting (also referred to as a recipe) by an input unit, control of ON and OFF of a microwave power supply or control of frequency, control of ON and OFF of an RF bias power supply or control of frequency, and control of parameters of the microwave power supply and the RF bias power supply. In addition, the control unit 122 can control etching parameters such as a gas flow rate, a processing pressure, and a coil current for performing the etching, a temperature of a sample stage, and an etching time.

(Description of Flowchart)

First, the valve 203 disposed between the gas cylinder 201 and the gas connection valve 204-1*a* of the mass flow controller box 204 maintains an open state (the valve 204-1*a* is in the open state, the mass flow controller 204-1*b* is in the open state, and the valves 205 and 215 between the valve 204-1*c* and the processing chamber 209 is in a closed state), and the valve 204-1*a* disposed between the gas cylinder 201 and the mass flow controller 204-1*b* is closed (401). Accordingly, the gas pipe 202 including the gas line 204-1 is filled with the gas from the gas cylinder 201. (401) can be referred to as a filling step. The filling step may include (401), and (409) and (410) described later.

Next, in order to exhaust a metal contamination source remaining in the gas pipes 202 and 204-1 without passing through the processing chamber 209, the valve 212 disposed between the dry pump 214 and the processing chamber 209 is closed, and the processing chamber 209 and the variable conductance valve 210 for controlling the pressure in the processing chamber 209 is closed (402).

Next, the dry pump 214, the valve 208 disposed on a gas supply side, the valve 206 disposed on a valve 204-1*c* side, and the valve 207 disposed on a valve 204-1*d* side are opened (403), and in order to exhaust the gas remaining in the valve 204-1*a* to the valve 204-1*d*, the valve 204-1*c*, and the valve 204-1*c* to valve 204-1*f* in the mass flow controller box 204, the valve 204-1*c* and the valve 204-1*d* are opened. Here, the valve 204-1*f* is in the closed state. The valve 204-1*f* may be in the open state. Then, the dry pump 214 exhausts, through the gas pipes 216, 217, and 218, the gas remaining in the valve 104-1*a* to the valve 104-1*d* (in the gas pipe 104-1), the valve 104-1*c*, and the valve 204-1*c* to the valve 204-1*f* (404). (404) can be referred to as an exhaust step. The exhaust step may include (404), (402), and (403).

At the time of exhaustion using the dry pump 214 (at the time of the exhaust step), monitoring (405) is performed until a pressure difference between the pressure gauge 204-1*e* and the pressure gauge 213 becomes zero (pressure value measured by the pressure gauge 204-1*e*=pressure value measured by the pressure gauge 213). If the pressure values are not equal (405: No), (404) is continued. If the pressure values are equal (405: YES), the valves 206, 207, and 208 are closed, and the exhaustion is ended (406). (405) and (406) can be referred to as monitoring steps. The control device CNT2 ends the exhaustion (exhaust step) based on a pressure measurement value obtained by the pressure gauge 213 that measures an exhaust pressure of the dry pump 114 and a pressure measurement value obtained by the pressure gauge 204-1*e* that measures a gas pressure of the gas cylinder 201.

Next, in order to lower the pressure in the processing chamber 209 that is increased in the above exhaust sequence, the valve 212 and the variable conductance valve 210 are opened (407), and the processing chamber 209 is exhausted for a predetermined time (408). (407, 408) can be referred to as a processing chamber exhaust step. For the exhaustion in the processing chamber exhaust step (407, 408), for example, the turbo molecular pump 211 and the dry pump 214 may be used. Thereafter, the valve 204-1*a* is opened, and the valve 204-1*a* to the valve 204-1*d* and the mass flow controller 204-1*b* (in the gas pipe 204-1) are filled with the gas (409). At this time, in order to also fill the valve 204-1*c* and the valve 204-1*f* (here, in the closed state) side with the gas, the valve 204-1*a* is opened, and the mass flow controller 104-1*b* is fully opened after one second (410).

As described above, since the invention is a sequence of repeating the gas filling (filling step), the exhaustion (exhaust step), and the monitoring (monitoring step), it is determined in (411) whether the number of performed cycles n (n being a positive integer) reaches a specified number of cycles N (N being a positive integer). (411) can be referred to as a repeating step. When it is determined in (411) that the number of performed cycles n does not reach the specified number of cycles N (n<N, 411: No), the processing returns to (401), and the filling sequence (filling step), the exhaust sequence (exhaust step), and the monitoring (monitoring step) described in (401 to 411) are repeated the specified number of cycles (N times). When it is determined in (411) that the number of performed cycles n reaches the specified number of cycles N (n=N, 411: Yes), the processing proceeds to (412).

The specified number of cycles (predetermined number of times) N is the number of times obtained by calculating a ratio of a length of the gas pipe 204-1 from the valve 204-1*a* to the valve 204-1*c* to a length of the gas pipe 202 from the gas cylinder 201 to the valve 204-1*a*.

After the repeating step (411), a determination step (412) of determining whether a specified gas type is ended is executed. In (412), whether the specified gas type is ended is determined. When the specified gas type is ended (YES), the present sequence is ended. On the other hand, when the specified gas type is not ended (No), the processing proceeds to (401). Then, another specified gas is switched, and (401 to 411) is repeated. That is, when the other gas type is also performed, the processing returns to (401) again after the gas filling sequence and the exhaust sequence are ended (401 to 412), and the same operation as (401 to 412) is repeated for the other gas type.

By applying the present sequence, it is possible to reduce the metal contamination source existing in the gas pipes 202 and 204-1.

As described above, the control device CNT2 executes the sequence illustrated in FIG. 4 in which the gas from the gas cylinder 201 with which the gas pipes 202 and 204-1 are filled is divided and exhausted, and the gas exhaustion is ended based on the exhaust pressure of the dry pump 214 (measured by the pressure gauge 213) and the gas pressure of the gas cylinder 201 (measured by the pressure gauge 204-1*e*).

According to the second embodiment, even if the etching processing device 11 is a multi-gas injection mechanism, the same effects as those of the first embodiment can be obtained.

In the second embodiment, the configuration has been described in which the valve opening and closing is automatically performed by the control device CNT2 that executes the sequence illustrated in FIG. 4, but the sequence illustrated in FIG. 4 may also be executed by an operator.

The configuration of the disclosure can be summarized as follows.

1) A plasma processing apparatus (10) including:

a processing chamber (108) in which a sample is to be plasma-processed;

a radio frequency power supply configured to supply radio frequency power for generating plasma;

a sample stage on which the sample is to be placed;

a gas supply mechanism configured to supply a gas to the processing chamber (108);

an exhaust device (114) configured to exhaust the gas; and a control device (CNT1) configured to execute a sequence (301, 304, 306, and 311) of exhausting a gas filled from a gas cylinder (101) in stages and ending gas exhaustion based on a pressure on an exhaust side of the exhaust device (114) and a gas pressure of the gas cylinder (101).

2) In the plasma processing apparatus according to the above 1), the gas supply mechanism includes a first valve (104-1*a*) disposed between the gas cylinder (101) and a gas flow rate control device (104), a second valve (107) disposed in a pipe (117) for exhausting the gas filled from the gas cylinder (101) without passing through the processing chamber (108), and a third valve (104-1*c*) disposed between the gas flow rate control device (104) and the processing chamber (108), the gas filled from the gas cylinder (101) is exhausted by the sequence a predetermined number of times, the predetermined number of times is a number of times obtained based on a ratio of a length of a pipe (104-1) from the first valve (104-1*a*) to the third valve (104-1*c*) with respect to a length of a pipe (102) from the gas cylinder (101) to the first valve (104-1*a*).

3) In the plasma processing apparatus according to the above 1), when the pressure on the exhaust side of the exhaust device (114) is approximately equal to the gas pressure of the gas cylinder (101), the control device (CNT1) ends the gas exhaustion.

4) In the plasma processing apparatus according to the above 1), the pressure on the exhaust side of the exhaust device (114) is a pressure between a turbo molecular pump (111) and a dry pump (114).

5) In the plasma processing apparatus according to the above 1), when a stopcock of the gas cylinder (101) is open, the sequence is executed by the control device (CNT1).

6) In the plasma processing apparatus according to the above 4), when a stopcock of the gas cylinder (101) is open, the sequence is executed by the control device (CNT1).

7) A gas exhaust method for exhausting a gas used in plasma processing, the gas exhaust method including:

exhausting a gas filled from a gas cylinder (101) in stages; and ending gas exhaustion based on a pressure on an exhaust side of an exhaust device (114) and a gas pressure of the gas cylinder (101).

The configuration of the disclosure can also be summarized as follows.

8) A plasma processing apparatus including:

a first valve (104-1*a*) disposed between a gas cylinder (101) and a mass flow controller (104-1*b*);

a second valve (107) configured to exhaust a gas filled from a dry pump (114) side;

a third valve (104-1*c*) disposed downstream of the mass flow controller (104-1*b*);

a fourth valve (106) configured to exhaust a gas filled in a third valve (104-1*c*) side;

a first pressure gauge (104-1*e*) provided between the first valve (104-1*a*) and the mass flow controller (104-1*b*) and configured to monitor a pressure of the gas cylinder (101);

a second pressure gauge (113) disposed between the dry pump (114) and a turbo molecular pump (111); and a control device (CNT1), in which the control device (CNT1) is configured to execute a filling step (301) of filling the gas cylinder (101) to the third valve (104-1*c*) with a gas and closing the first valve (104-1*a*), an exhaust step (304) of opening the second valve (107) and the fourth valve (106) (303) and exhausting the filled gas after the filling step (301), a monitoring step (306) of monitoring (305) until a pressure difference between the first pressure gauge (104-1*e*) and the second pressure gauge (113) becomes equal, and then closing the second valve (107) and the fourth valve (106), and a repeating step (311) of repeating the filling step, the exhaust step, and the monitoring step a predetermined number of times.

9) In the plasma processing apparatus according to the above 8), the predetermined number of times is a number of times obtained by calculating a ratio of a length of a gas pipe (104-1) from the first valve to the third valve to a length of the gas pipe (102) from the gas cylinder to the first valve.

10) The plasma processing apparatus according to the above 8) further including:

a processing chamber (108);

a fifth valve (105) provided between the third valve (104-1*c*) and the processing chamber (108); and a sixth valve (104-1*d*) provided between the mass flow controller (104-1*b*) and the second valve (107), in which the control device (CNT1) is configured to close the fifth valve (105) in the filling step, the exhaust step, and the monitoring step, close the sixth valve (104-1*d*) in the filling step, and open the sixth valve (104-1*d*) in the exhaust step.

11) The plasma processing apparatus according to the above 10) further including:

a seventh valve (109) disposed between the dry pump (114) and the turbo molecular pump (111); and an eighth valve (112) disposed between the processing chamber (108) and the turbo molecular pump (111), in which the control device (CNT1) is configured to execute, after the monitoring step, a processing chamber exhaust step (307, 308) of opening the seventh valve (109) and the eighth valve (112) to exhaust the processing chamber (108) by the dry pump (114) and the turbo molecular pump (111).

12) In the plasma processing apparatus according to the above 11), the control device (CNT1) is configured to execute, after the processing chamber exhaust step (307, 308), the repeating step (311) after opening the first valve (104-1*a*) and the mass flow controller (104-1*b*).

13) In the plasma processing apparatus according to the above 8), the control device (CNT1) is configured to execute, after the repeating step (311), a determination step (312) of determining whether a specified gas type is ended, when the specified gas type is ended, end the filling step, the exhaust step, and the monitoring step, and when the specified gas type is not ended, switch to another specified gas type to execute the filling step, the exhaust step, and the monitoring step.

14) The plasma processing apparatus according to the above 10) further including:

a ninth valve (104-1*f*) provided between the mass flow controller (104-1*b*) and the processing chamber (108); and a tenth valve (215) provided between the ninth valve (104-1*f*) and the processing chamber (108), in which the ninth valve (104-1*f*) and the tenth valve (215) can be exhausted by the dry pump (114) via the second valve (107), and the control device (CNT1) is configured to close the fifth valve (105) and the tenth valve (215) in the monitoring step, close the sixth valve (104-1*d*) in the filling step, and open the sixth valve (104-1*d*) in the exhaust step.

While the invention made by the inventor has been described in detail based on the embodiments, the invention is not limited to the above embodiments, and various modifications can be made.

REFERENCE SIGNS LIST

101: gas cylinder
102: gas pipe
103: valve
104: mass flow controller box
104-1 to 104-*n*: gas line
104-1*a* to 104-*na*: valve
104-1*b* to 104-*nb*: mass flow controller
104-1*c* to 104-*nc*: valve
104-1*d* to 104-*nd*: valve
104-1*e* to 104-*ne*: pressure gauge
105: valve
106: valve
107: valve
108: processing chamber
109: valve
110: variable conductance valve
111: turbo molecular pump
112: valve
113: pressure gauge
114: dry pump
115: bypass line
116: bypass line
117: bypass line
201: gas cylinder
202: gas pipe
203: valve
204-1 to 204-*n*: gas line
204-1*a* to 204-*na*: valve
204-1*b* to 204-*nb*: mass flow controller
204-1*c* to 204-*nc*: valve
204-1*d* to 204-*nd*: valve
204-1*e* to 204-*ne*: pressure gauge
204-1*f* to 204-*nf*: valve
205: valve
206: valve
207: valve
208: valve
209: processing chamber
210: variable conductance valve
211: turbo molecular pump
212: valve
213: pressure gauge
214: dry pomp
215: valve
216: bypass line

217: purge line

218: bypass line

CNT1, CNT2: control circuit

The invention claimed is:

1. A plasma processing apparatus comprising:

a processing chamber in which a sample is to be plasma-processed;

a radio frequency power supply configured to supply radio frequency power for generating plasma;

a sample stage on which the sample is to be placed;

a gas supply mechanism configured to supply a gas to the processing chamber;

an exhaust device configured to exhaust the gas; and a control device configured to execute a sequence of exhausting a gas filled from a gas cylinder in stages and ending gas exhaustion based on a pressure on an exhaust side of the exhaust device and a gas pressure of the gas cylinder, wherein the gas supply mechanism includes a first valve disposed between the gas cylinder and a gas flow rate control device, a second valve disposed in a pipe for exhausting the gas filled from the gas cylinder without passing through the processing chamber, and a third valve disposed between the gas flow rate control device and the processing chamber, the gas filled from the gas cylinder is exhausted by the sequence a predetermined number of times, and the predetermined number of times is a number of times obtained based on a ratio of a length of a pipe from the first valve to the third valve with respect to a length of a pipe from the gas cylinder to the first valve.

2. The plasma processing apparatus according to claim 1, wherein when the pressure on the exhaust side of the exhaust device is approximately equal to the gas pressure of the gas cylinder, the control device ends the gas exhaustion.

3. The plasma processing apparatus according to claim 1, wherein the pressure on the exhaust side of the exhaust device is a pressure between a turbo molecular pump and a dry pump.

4. The plasma processing apparatus according to claim 3, wherein when a stopcock of the gas cylinder is open, the sequence is executed by the control device.

5. The plasma processing apparatus according to claim 1, wherein when a stopcock of the gas cylinder is open, the sequence is executed by the control device.

* * * * *